United States Patent [19]
Eisenstadt et al.

[11] Patent Number: 5,164,817
[45] Date of Patent: Nov. 17, 1992

[54] DISTRIBUTED CLOCK TREE SCHEME IN SEMICONDUCTOR PACKAGES

[75] Inventors: Robert E. Eisenstadt, Santa Clara; Dean P. Johnson, Cupertino, both of Calif.

[73] Assignee: VLSI Technology, Inc., San Jose, Calif.

[21] Appl. No.: 744,860

[22] Filed: Aug. 14, 1991

[51] Int. Cl.⁵ .................... H01L 23/02; H01L 23/12
[52] U.S. Cl. .................................... 307/480; 257/786
[58] Field of Search ................................ 357/70, 74

[56] References Cited

U.S. PATENT DOCUMENTS 4,427,991 1/1984 Yamamura et al. ................. 357/74

Primary Examiner—John D. Lee
Assistant Examiner—Robert E. Wise
Attorney, Agent, or Firm—Majestic, Parson, Siebert & Hsue

[57] ABSTRACT

A clock plane is embedded in the housing of a semiconductor chip package where the plane is connected to two or more clock pads on the semiconductor die through vias, bonding fingers and bonding wires. The two or more clock pads are connected by one or more clock lines. The clock plane is connected by means of a via to a clock iput pin. In this manner, a clock signal fed to the clock input pin is driven through the one or more clock line with its tributaries from two separate locations by two or more input clock pads. This reduces clock skew and permits a smaller area of the die surface to be taken up by the clock lines.

22 Claims, 3 Drawing Sheets

DISTRIBUTED CLOCK TREE SCHEME IN SEMICONDUCTOR PACKAGES

BACKGROUND OF THE INVENTION

This invention relates in general to clock tree schemes in semiconductor dies and in particular to a distributed clock tree scheme for reducing the die area occupied by the clock tree while reducing clock skew and inductance of the clock tree connection.

Clock signals are required for the operation of many circuits fabricated on semiconductor dies. In integrated circuits, clock signals are frequently required for the operation of many circuits located on different parts of the semiconductor die. For this reason, the conventional scheme for routing the clock signal for these different parts of the die is to fabricate an electrically conductive clock tree spine on the die surface driven by means of a clock pad as shown if FIG. 1.

FIG. 1 is a top view of a portion of a semiconductor chip package illustrating a conventional clock tree scheme. As shown in FIG. 1, package 10 includes a semi-conductor die 12 and a number of electrically conducting bond posts (collectively labelled 14) surrounding the die. In a ceramic package, the group of bond posts 14 would be located on top of a ceramic surface inside the package. In a plastic package, bond posts 14 would form a portion of a leadframe (not shown) or form conductive traces on top of a substrate for supporting the die 12. At the edge of the die surface are a number of pads 16 suitable to be connected to one of the bond posts 14. Each of the pads may be electrically connected to one of the bond posts by means of a bonding wire so that electrical circuits fabricated in the die and electrically connected to the pads may be accessed for input/output functions through the bond posts connected to the pads as in a manner known to those skilled in the art. One of the pads at the edge of the die is a clock pad 18, used for driving a clock signal down the clock tree spine 20.

As shown in FIG. 1, clock tree spine 20 has a main clock line 22 and a number of tributaries 24 connected electrically to the main line 22 as shown in FIG. 1. Clock pad 18 is electrically connected to the main line 22. The clock tree spine 20 and clock pad 18 may be simply formed as a single metal layer in a process. A bonding wire 32 connects the clock pad 18 to one of the posts 14a. In this manner, a clock signal fed to post 14a will pass through wire 32 to clock pad 18. Clock pad 18 may be of a conventional construction. Any number of clock input pads may be used. One example is VLSI Macro No. PC6C04 which is a CMOS inverting clock input pad with 4X driver. Incorporated by reference are data sheets on PC6C04, a copy of which is attached. Analogous clock input pads are available from other vendors such as LSI Logic.

The driver of the clock pad drives the clock signal fed to it through finger 14a and bonding wire 32 down the main clock line 22 and to the tributaries 24. In this manner, the clock signal fed to package 10 is supplied to different areas of the die 12. The clock signal is then available at different parts of the chip or die for connection to and operation of circuits on different parts of the die. The clock tree spine 20 itself has a certain capacitance and resistance. Therefore, when the clock signal is driven down the spine by pad 18, the clock signal will encounter a delay when it travels down the spine from pad 18. In other words, the clock signal taken at the end of this main clock line 22, such as at point b, will be delayed relative to the clock signal taken from a point upstream, such as at point a. Even for small dies, the distance between points a and b can be as much as 500 mils, resulting in the delay of the order of 1 nanosecond. This is known as clock skew which is undesirable since it introduces a delay between the clock signals used for operating different circuits on the same die.

One solution for reducing clock skew which has been used in conventional design is to use a thicker main clock line. A thicker clock line reduces the resistance of the line and therefore reduces the delay caused by the line and the resulting clock skew. Increasing the width of the clock line has the disadvantage of taking up more precious real estate on the die surface. It is therefore desirable to provide a clock tree scheme whereby width of the clock tree spine needed is reduced while maintaining an acceptable clock skew or even reducing clock skew.

SUMMARY OF THE INVENTION

This invention is based on the observation that, by providing an electrically conducting layer referred to below as a clock plane in the package body of a semiconductor chip package, and by connecting the plane to a clock tree spine at two separate locations, the width of the clock tree spine may be reduced without increasing or even actually reducing clock skew.

This invention is directed towards a semiconductor chip package comprising a semiconductor die including a clock tree spine thereon and a housing enclosing and supporting the die. The housing has therein a conducting layer. The package further includes means for electrically connecting the layer to the clock tree spine at at least two separate locations and a pin or lead attached to the housing and electrically connected to said layer. When a clock signal is applied to the pin or lead, the clock signal is fed to the clock tree spine at at least the two separate locations.

DETAILED DESCRIPTION OF THE PREFERRED EMBODIMENT

Figure 1:
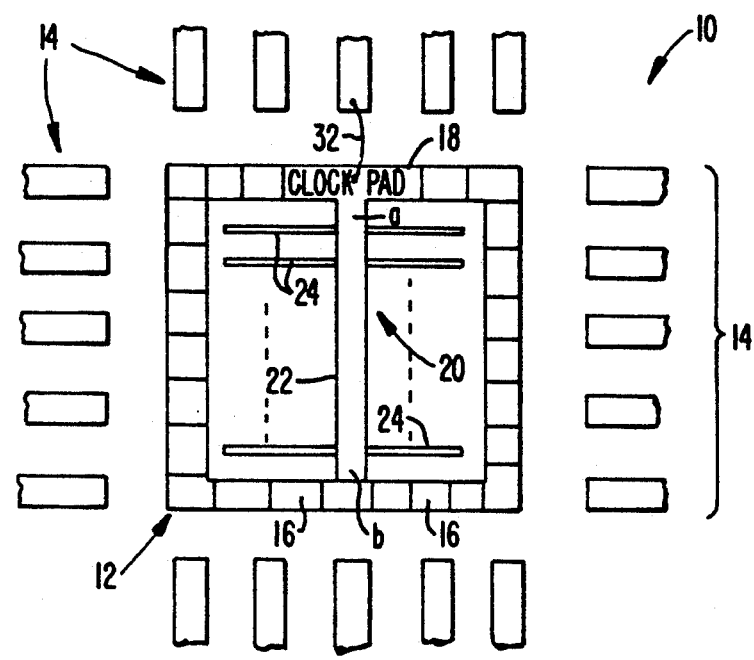
FIG. 1 is a top view of portions of a semiconductor chip package to illustrate a conventional clock tree design.
Figure 2:
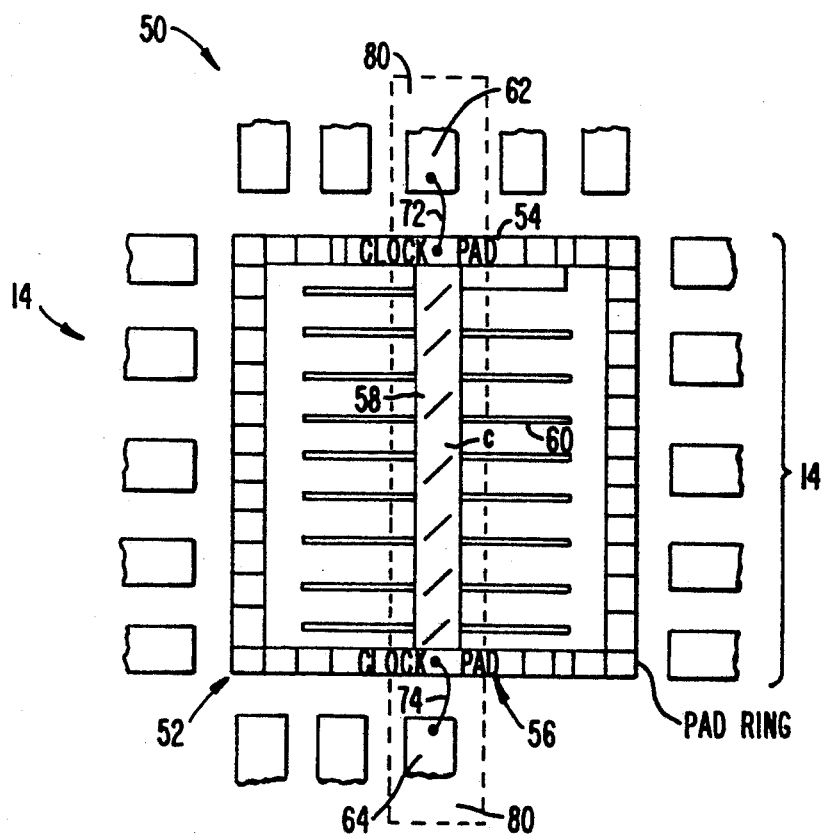
FIG. 2 is a top view of portions of a semiconductor package showing a distributed clock tree scheme to illustrate an embodiment of the invention.

To simplify the description, identical parts are referred to by the same numerals in the figures of this application. As shown in FIG. 2, package 50 differs from package 10 of FIG. 1 in a number of respects. In contrast to semiconductor die 12 of FIG. 1, semiconductor die 52 has two clock pads 54, 56 connected by a main clock line 58 which is of narrower width than clock line 22 of FIG. 1. Tributaries 60 connect main clock line 58 to different parts of the die 52, making the clock signal present on the main clock line available to different areas on the die. Bond posts 14 include bond posts 62, 64. A bonding wire 72 connects bond post 62 to clock pad 54 and bonding wire 74 connects bond post 64 to clock pad 56. Package 50 includes a housing in which is provided a clock plane 80 electrically connected to both bond posts 62, 64 by means of vias (not shown in FIG. 2).

In order to operate the circuits on die 52, a clock signal is fed to the buried clock plane 80. The clock signal from plane 80 then passes through vias to fingers 62, 64, bonding wires 72, 74 and then to clock pads 54, 56 respectively. The clock plane 80 is relatively large so that it has low inductance and introduces insignificant clock delay. For this reason, irrespective of at what point on the clock plane the clock signal is fed to the clock plane, the clock signals fed to pads 54, 56 are substantially synchronous. The two clock pads 54, 56 then drive the clock signals down the main clockline 58 from two opposite directions. This means that the maximum clock skew caused by the maximum delay on account of the main clock line 58 is at the midpoint c of the clock line 58. If the main clock line 58 is of the same width as the main clock line 22 of FIG. 1, the maximum clock skew present at point c may be about half of the clock skew between points a and b in FIG. 1. Thus the design of package 50 essentially reduces the clock skew by a factor of about two compared to the conventional design of FIG. 1. Alternatively, if more clock skew can be tolerated, the width of the main clock line 58 may be reduced compared to the main clock line 22 of FIG. 1 to thereby reduce the precious surface area occupied by the main clock line 58. Adopting such alternatives allows a greater surface area of the die to be available for the fabrication of other circuits.

Figure 3:
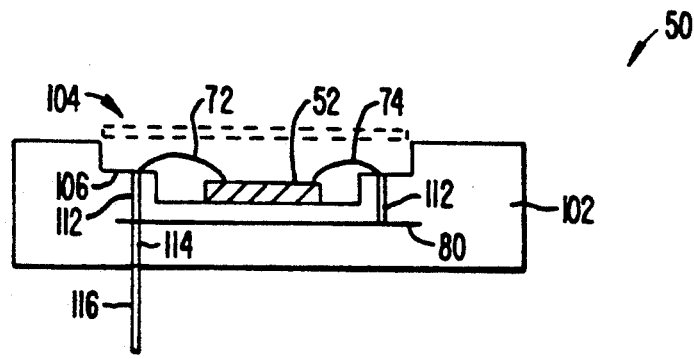
FIG. 3 is a cross-sectional view of a simplified ceramic pin grid array type package to illustrate the invention.

FIG. 3 is a simplified cross-sectional view of a ceramic pin grid array type package to illustrate the invention, where, except for the clock pin and its connection to the clock pads, the other pins of the package and the connections to the die have been omitted to more clearly illustrate the invention. Since the package shown in FIG. 3 is a particular implementation of the package 50 of FIG. 2, the package in FIG. 3 is referred to by the numeral 50'. Package 50' is a ceramic pin grid array type package including a ceramic body 102 and a lid 104. Bond posts 14, including bond posts 62 and 64 (not shown in FIG. 3) are located on surface 106 of the housing 102. Bonding wires 72, 74 connect the clock pads on die 52 to bond posts 62, 64 present on surface 106, where the two bond posts are connected by means of vias 112 to the clock plane 80. Clock plane 80 is in turn connected by means of via 114 to a clock pin 116 as shown in FIG. 3. Therefore, in order to operate the circuits on die 52, a clock signal is fed through clock pin 116, vias 114, to clock plane 80, where the signal is then routed through vias 112 to bond posts 62, 64, bonding wires 72, 74 to clock pads 54, 56 as described in above in reference to FIG. 2.

Figure 4:
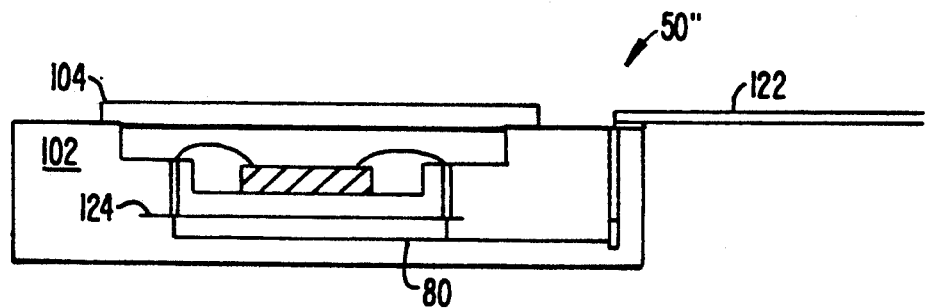
FIG. 4 is a simplified cross-sectional view of a leaded ceramic chip carrier type package to illustrate the invention.

FIG. 4 is a simplified cross-sectional view of a leaded ceramic chip carrier type package to illustrate another implementation of package 50 of FIG. 2. As another implementation of package 50 of FIG. 2, the package in FIG. 4 is referred to as package 50". From a comparison of the packages of FIGS. 3 and 4, it will be evident that the two types of packages are quite similar. They differ in that, in the package 50', the clock pin 116 emerges from the bottom of the lid. In package 50" of FIG. 4, however, the clock pin or lead 122 is provided on the top side of the package (i.e. on the same side as the lid 104).

Package 50" illustrates another feature of the invention not present in FIG. 3. When a clock plane is embedded in the housing near the die, the clock signal present on the clock plane 80 may adversely affect the operation of the circuits in the die and the passage of signals through the package to the die. For this reason, a ground or power plane 124 is present between the clock plane 80 on one side and the die and various connections to the die on the other, in order to shield the die and the various connections from the clock signal present on the clock plane.

Power and ground planes are present in many semiconductor packages to provide ground and power connections for the proper operation of various circuits on the die and to reduce signal noise. In such event, the respective locations of the clock plane on one hand and the power or ground plane on the other are chosen in a manner illustrated in FIG. 4 to shield the clock plane from the die and its various connections. Preferably, the ground or power plane so used is at least as large as the clock plane and preferably larger than the clock plane.

If the clock plane is large, capacitance effects increase its impedance and render the clock input of the package more difficult to drive. This is undesirable. For this reason, it is preferable for the clock plane to be not too large so as to reduce its capacitance while retaining a low inductance. Preferably, the area of the clock plane is less than about 30% of the die area (i.e. the surface area on one side of the die), and preferably in the range of about 5% to 30% of the die surface area.

Figure 5:
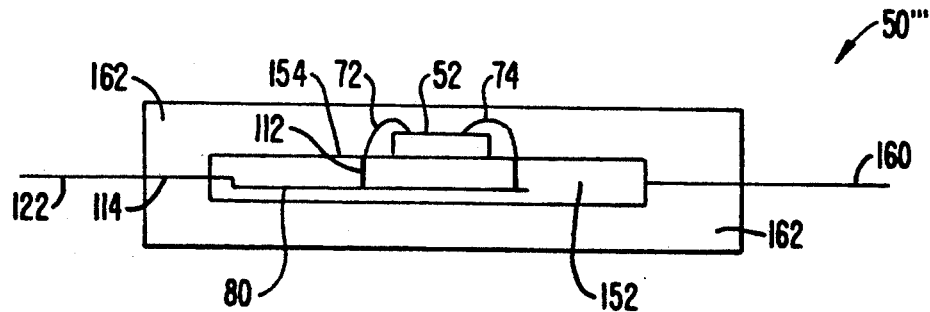
FIG. 5 is a simplified cross-sectional view of a plastic molded package with an interposer to illustrate the invention.

FIG. 5 is a simplified cross-sectional view of a plastic molded package with interposer to illustrate another implementation of the package of FIG. 2. As shown in FIG. 5, package 50''' includes an interposer 152 for supporting the die 52. Bond posts 62, 64 (not shown) as well as other posts 14 (not shown) are provided on the top surface 154 of the interposer. Posts 62, 64 are connected by bonding wires 72, 74 respectively to the clock pads (not shown) on die 52. Vias 112 connect posts 62, 64 to clock plane 80 which in turn is connected to a clock lead 122 by means of via or lead 114. Thus to construct the package 50''' of FIG. 5, an interposer 152 is provided which has embedded therein a ground plane 80. Bond posts 14 include posts 62 and 64 on surface 154 of interposer 152, and via or lead 114 connects clock plane 80 to an outside lead 122. Clock plane 80, via or lead 114 and outside lead 122 may conveniently be made from a single integral electrically conductive sheet of material. After the die is placed on surface 154 and bonding wires 72, 74 and other bonding wires are in place, the entire structure except for clock lead 122 and other external leads 160 are enclosed by means of a second body 162. Body 162 may be made by a conventional plastic molding technique such as injection or transfer molding.

Figure 6:
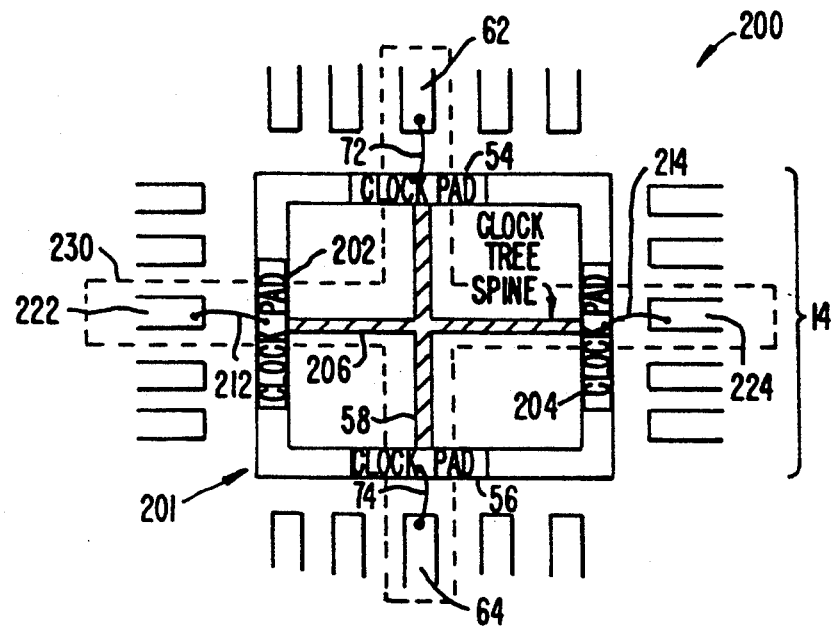
FIG. 6 is a top view of portions of a semiconductor package to illustrate an alternative embodiment.

FIG. 6 is a top view of a portion of a semiconductor chip package to illustrate an alternative embodiment of the invention. As shown in FIG. 6, package 200 differs from package 50 of FIG. 2 in that, instead of having two clock pads connected by a single main clock line as in package 50, package 200 includes four clock pads forming two pairs of clock pads, each pair located on the opposite sides of the substantially rectangular or square die, each pair connected by a main clock line. Thus as shown in FIG. 6, the pair of clock pads 54, 56 are connected by a main clock line 58 while another pair of clock pads 202, 204 are connected by a second main clock line 206. Clock pads 202, 204 are connected respectively by bonding wires 212, 214 to bond posts 222, 224 respectively. The four posts 62, 64, 222, 224 are each connected by means of vias (not shown in FIG. 6) to a ground plane 230 which, to accommodate convenient connection to the four posts, may be cross-shaped as shown in FIG. 6.

Where die 201 is rectangular or square in shape, clock pads 54 and 56 are preferably located at or near the center points of two of its opposite edges forming a pair of pads connected by a first main clock line 58 and clock pads 202, 204 are located at or near the center points of the remaining two opposite edges of the die and are connected by a second main clock line 206. The clock lines 58, 206 are preferably substantially perpendicular to each other. The tributaries connected to the two clock lines are not shown to simplify the drawing. With such design, clock skew is further reduced, compared to package 50 of FIG. 2, particularly where the clock signal is required at points away from pads 54, 56 in FIG. 2. Using four clock pads to drive the clock signal along the two intersecting main clock lines and their tributaries provides better capability for driving the clock signal. Having two clock pads as in FIG. 2 in turn provides better capability for driving the clock signal compared to the conventional design.

Figure 7:
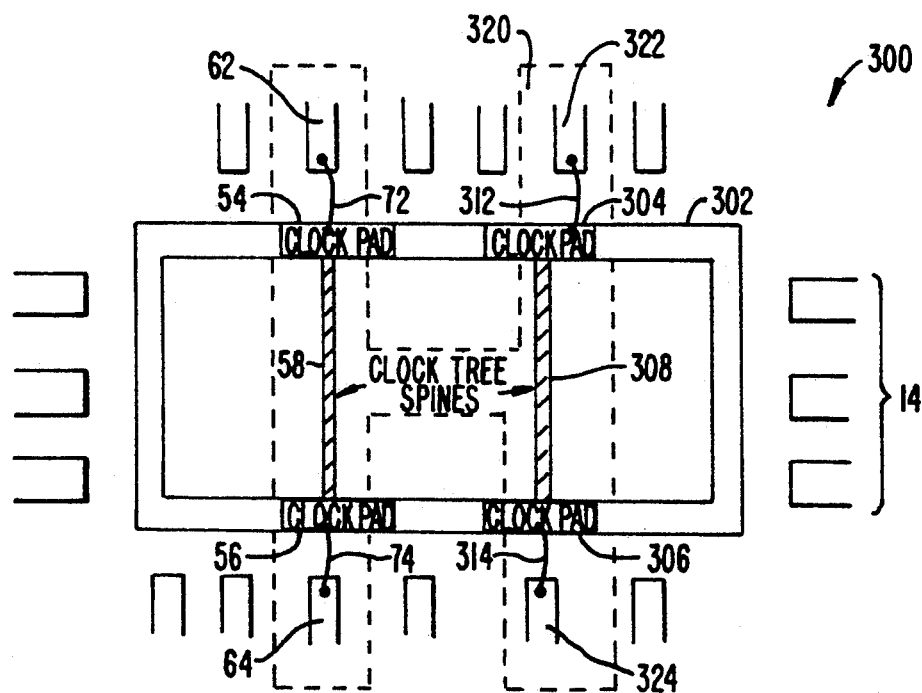
FIG. 7 is a top view of portions of a semiconductor chip package to illustrate yet another embodiment of the invention.

FIG. 7 is a top view of a portion of a semiconductor chip package 300 illustrating yet another alternative embodiment of the invention. For semiconductor dies which are elongated, it may be preferable to employ this distributed clock tree scheme of FIG. 7. As shown in FIG. 7, semiconductor die 302 is rectangular is shape where one pair of opposite sides or edges is much longer than the other pair of opposite sides. In such event it may be desirable for the two pairs of clock pads; pair 54, 56 and pair 304, 306 to be both located on the longer sides of the die, where the two pairs of pads are evenly distributed along the pair of longer sides of the rectangular die such as shown in FIG. 7 so as to minimize the distance of any point on the die from the closer of the two main clock lines 58, 308 connecting respectively the two pairs of clock pads. Again, the tributaries of the two main clock lines are not shown to simplify the Figure. Preferably, the two main clock lines 58, 308 are substantially parallel to each other. The clock pads 54, 56, 304, 306 are each connected to one of the four corresponding bond posts 62, 64, 322, 324 by means of corresponding bonding wire 72, 74, 312 and 314. To accommodate the locations of the posts, clock plane 320 is preferably "H"-shaped so that vias conveniently connect such plane to the four posts. The clock plane 320 is then connected to a single clock input pin in the same manner as that described for the previously described embodiment.

As in the case of package 50 of FIG. 2, the main clock lines 58, 206, 308 of FIGS. 6 and 7 may have narrower widths compared to the main clock lines in the conventional design. Furthermore, the widths of main clock lines 58, 206, 308 may be reduced to widths less than about 25 mils; preferably, the widths are in the range of 2-20 mils. The ground planes 80, 230 and 320 preferably have areas which are less than about 30% of the die surface and preferably in the range of about 2% to 30% of the die area.

While the invention has been described by reference to various embodiments, it will be understood that modifications may be made without departing from the scope of the invention. While only one pair or two pairs of clock pads with one or two clock lines have been shown and described, it will be understood that more clock pads and clock lines may be used than shown to accommodate a particular shape of the die surface in order to minimize the distance between any point on the die surface and the clock line. The shape of the clock plane is similarly modified for convenient connection to the fingers connected to the clock pads. While the clock pads are shown as located at the edges of the die, it will be understood that the clock pads may be located at interior portions of the die surface as well; or such variations as are within the scope of the invention. The scope of the invention is to be limited only by the appended claims.

What is claimed is:

1. A semiconductor chip package comprising;
   a semiconductor die including a clock tree spine thereon;
   a housing enclosing and supporting the die, said housing having therein an electrically conducting layer;
   means for electrically connecting said layer to the clock tree spine at at least two separate locations; and
   a pin or lead attached to said housing and electrically connected to said layer, wherein when a clock signal is applied to said pin or lead, said clock signal is fed to the clock tree spine at at least said two separate locations.

2. The package of claim 1, said housing including via means electrically connecting said pin or lead to said layer.

3. The package of claim 2, said die having a pad thereon, said housing including a body having a surface adjacent to the die, two or more electrically conducting bond posts on the surface of said body, and two or more vias each connecting a bond post to said layer, wherein said connecting means further comprises bonding wires each connecting a bond post to the pad.

4. The package of claim 3, wherein said body includes a ceramic material.

5. The package of claim 3, said body including a substrate in which said layer and the two or more vias are embedded, said housing further comprising a second body encapsulating said substrate, bonding wires and the semiconductor die.

6. The package of claim 5, wherein said second body includes a plastic material.

7. The package of claim 1, wherein said housing includes a body which encloses the die, and wherein said layer includes a clock signal conducting plane in said body.

8. The package of claim 7, said body has embedded therein a power or ground plane located between said clock signal conducting plane and the die.

9. The package of claim 8, said body having a surface adjacent to the die, two or more electrically conducting bond posts on the surface of said body, and two or more vias each connecting a bond post to said layer, wherein said connecting means further comprises bonding wires each for connecting a bond post to the spine, said power or ground plane separating the posts and bonding wires from and being at least as large as the clock signal conducting plane to thereby electrically shield the clock signal conducting plane from the die, the bonding wires and the fingers.

10. The package of claim 1, wherein said die includes at least two clock input pads at two separate locations, each pad electrically connected to said clock tree spine and connected to the layer by said connecting means.

11. The package of claim 10, wherein said die has two opposite sides and two of said clock input pads are located on opposite sides of the die, said two input pads being connected by said spine.

12. The package of claim 11, said spine comprising a first main clock line connecting the input pads and a plurality of tributaries connected to said main clock line.

13. The package of claim 12, said spine further comprising a second main clock line and a plurality of tributaries connected to said second main clock line.

14. The package of claim 13, said second main clock line being substantially perpendicular to said first main clock line forming a cross shaped configuration.

15. The package of claim 14, wherein said die is substantially rectangular or square in shape, said die including at least four input pads, and wherein at least one input pad is located at or near the center location of a side of the rectangle or square.

16. The package of claim 15, wherein said first and second main clock line each connecting a pair of input pads located on opposite sides of the rectangle or square.

17. The package of claim 13, said second main clock line being substantially parallel to said first main clock line.

18. The package of claim 10, wherein said die has two opposite sides and at least two pairs of clock input pads located on opposite sides of the die, each of said two pairs of input pads being connected by one of the two main clock lines.

19. The package of claim 1, wherein the width of said spine is less than about 25 mils.

20. The package of claim 1, wherein the width of said spine is between about 2 and 20 mils.

21. The package of claim 1, wherein the area of said layer is no larger than about 30% of that of the die.

22. The package of claim 1, wherein the area of said layer is in a range of about 2% to about 30% of that of the die.

* * * * *